（12） United States Patent
Kato et al.

(10) Patent No.: US 6,381,137 B1
(45) Date of Patent: Apr. 30, 2002

(54) SEMICONDUCTOR MODULE (75) Inventors: Nobuhiro Kato; Takao Nakajima; Masaaki Kusui, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/620,720

(22) Filed: Jul. 20, 2000

(30) Foreign Application Priority Data

Jan. 27, 2000 (JP) ........................................ 2000-018663

(51) Int. Cl.$^7$ ................................................ H05K 7/20
(52) U.S. Cl. ...................... 361/704; 165/86.2; 165/185; 174/16.3; 257/713; 257/719; 361/710; 361/719
(58) Field of Search ................. 165/86.2, 86.3, 165/185; 174/16.3; 257/706–707, 712–713, 718–719, 722, 726–727; 361/688, 690, 702–711, 714–722

(56) References Cited

U.S. PATENT DOCUMENTS 3,277,346 A * 10/1966 Mcadam et al. ............. 361/688
4,254,447 A * 3/1981 Griffis ........................ 361/704
4,730,235 A * 3/1988 Newton ...................... 361/704
5,978,224 A * 11/1999 Barrow ....................... 361/704

FOREIGN PATENT DOCUMENTS

JP          10-41442        2/1998

* cited by examiner

Primary Examiner—Gregory Thompson
(74) Attorney, Agent, or Firm—McDermott, Will & Emery (57) ABSTRACT The present invention is to provide a semiconductor module, which can effectively dissipate heat generated by the semiconductor components disposed on the circuit board, with a simple structure to manufacture inexpensively.

13 Claims, 7 Drawing Sheets

SEMICONDUCTOR MODULE

BACKGROUND OF THE INVENTION

1.) Technical Field of the Invention

The present invention relates to a semiconductor module incorporating a heat-spreader dissipating heat produced by a semiconductor memory device mounted thereon.

2.) Description of Related Arts

A semiconductor module comprises a plurality of components such as the semiconductor memory device, each of which should be kept at or under a predetermined tolerable operation temperature so that each component can operate to function appropriately.

Especially, since the memory device such as Rambus DRAM running at a high transfer rate, produces enormous heat during the operation, the package of the semiconductor module substantially heats up. Without dissipating heat, the semiconductor module may overheat to malfunction. Therefore, it is critical to maintain the temperature of each component of the semiconductor module less than the predetermined tolerable operation temperature.

In general, a heat-spreader (a heat dissipating plate) is applied for dissipating the heat produced by the semiconductor components mounted on the circuit board, for example, the memory devices so as to prevent the semiconductor module from malfunctioning. The heat-spreader is disposed in contact as widely as possible with each of such semiconductor components to maximize the heat dissipating effect.

Meanwhile, the semiconductor module includes a plurality of semiconductor components, each of which has a height from the surface of the circuit board to the top surface thereof. The height of the semiconductor component is referred to as a "mounting height" hereinafter. The mounting heights of the semiconductor components have deviated from one another, for example, due to the mounting conditions of the semiconductor components. Therefore, in case where the heat-spreader used for the heat dissipating plate is disposed upon the semiconductor components mounted on the circuit board, the semiconductor component having the shorter mounting height cannot reach to and contact with the heat-spreader with a gap therebetween.

As described above, the semiconductor component spaced from the heat-spreader may overheat to malfunction without dissipating heat through the heat-spreader.

In order to solve the problem due to the unevenness of the mounting heights, a conventional semiconductor module takes an approach to dissipate heat produced by the semiconductor components by interposing a thermal sheet with a high thermal conductivity between the heat-spreader and the semiconductor components.

Figure 8A:
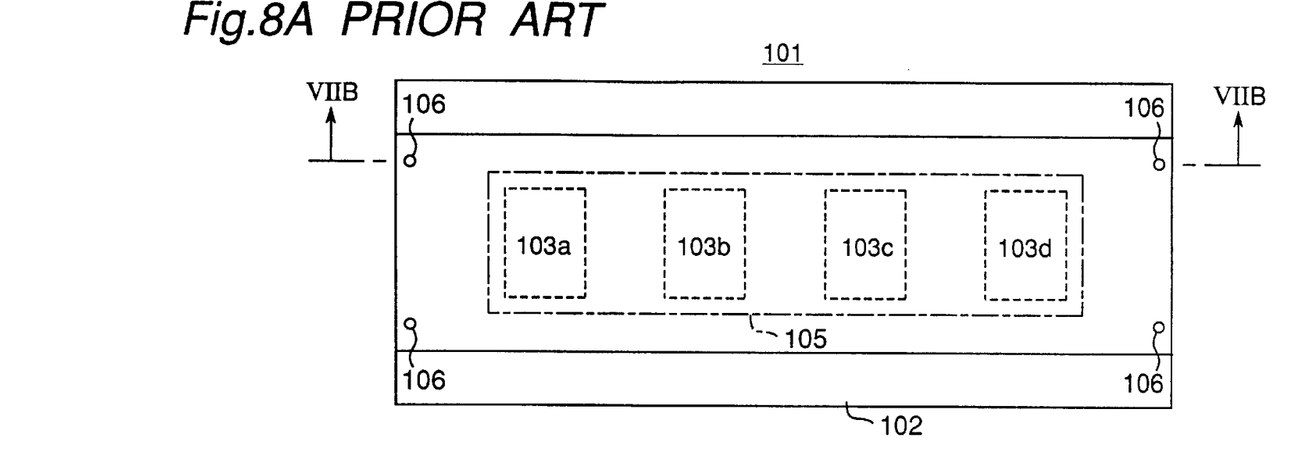
FIG. 8A is a schematic top view of the conventional semiconductor module.
Figure 8B:
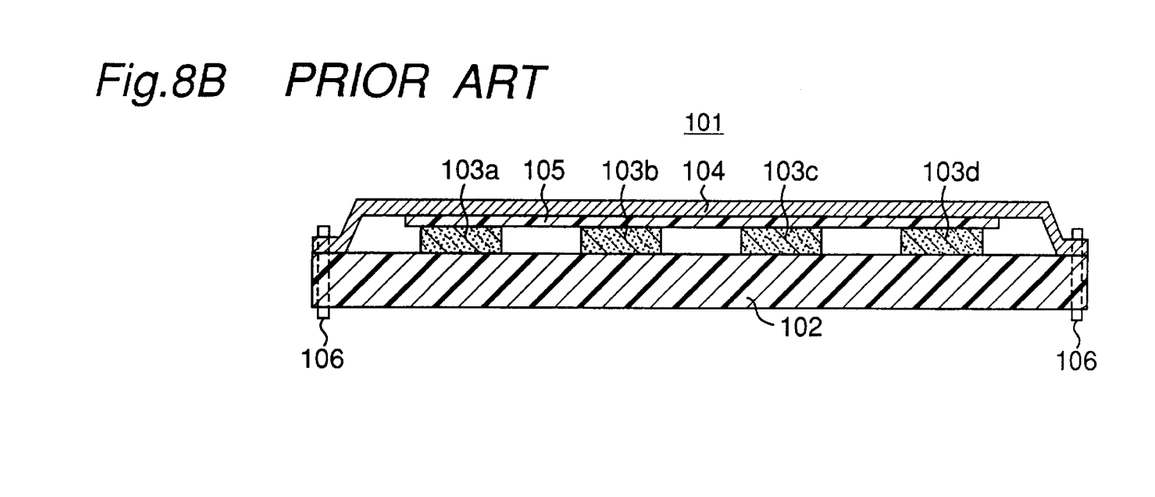
FIG. 8B is a cross sectional view taken along a line VIIIB—VIIIB in FIG. 8A.

Referring to FIGS. 8A and 8B, the conventional semiconductor module dissipating heat through the thermal sheet and the heat-spreader will be described in detail hereinafter. FIG. 8A is a schematic top view of the conventional semiconductor module, and FIG. 8B is a cross sectional view taken along a line VIIIB—VIIIB in FIG. 8A. As shown in the drawings, the conventional semiconductor module 101 comprises, in general, a circuit board 102 made of material such as epoxy resin and circuit patterns printed thereon (not shown).

The conventional semiconductor module 101 further comprises a plurality of semiconductor components 103 (for example, memory devices 103a, 103b, 103c, 103d), which are mounted on the circuit board 102 and connected with the aforementioned circuit patterns, and a heat-spreader 104 made of material such as metal or alloy of aluminum with a comparatively high thermal conductivity. When the heat-spreader 104 is disposed on the semiconductor components 103, as the mounting heights of the semiconductor components 103 are not even, all of the semiconductor components 103 are not always in contact with the heat-spreader 104, and the semiconductor components 103 with shorter mounting heights are spaced away from the heat-spreader 104 with a gap.

To address this problem, the conventional semiconductor module fills this gap between the semiconductor components 103 and the heat-spreader 104 with the thermal sheet 105 made of material such as resin with a high thermal conductivity. This thermal sheet 105 is made of resin with some flexibility, so that when the heat-spreader 104 presses the thermal sheet 105 against the semiconductor components 103, the thermal sheet 105 can closely contact with both the semiconductor components 103 and the heat-spreader 104. Thus, the conventional semiconductor module 101 can dissipate heat produced by the semiconductor components 103 through the thermal sheet 105 and the heat-spreader 104. As shown in FIG. 8B, the heat-spreader 104 includes a pair of opposing end portions which are bent downwardly to provide a portion for securing the heat-spreader 104 onto the circuit board 102 with a securing member 106 such as rivets.

As described above, the conventional semiconductor module 101 is comprised such that heat generated by the semiconductor components 103 is diffused through the thermal sheet 105, which closely contacts with the semiconductor components 103 and the heat-spreader 104.

However, since the thermal sheet 105 is generally made of resin, it has a thermal conductivity substantially less than that of aluminum metal. This causes heat produced by the semiconductor components 103 to prevent from being diffused enough to the heat-spreader 104. Eventually, this leads the semiconductor components 103 overheated to malfunction when the semiconductor components 103 cannot be kept at or under the predetermined tolerable operation temperature.

To address this problem, an another conventional semiconductor module 101 disclosed in JPA 11-15566, incorporates a thermal sheet 105 (a flexible thermally conductive member) which has a great flexibility and a high thermal conductivity so that the thermal sheet 105 can more closely contact with the heat-spreader 104 and semiconductor components 103 to sufficiently diffuse heat. Yet, this approach raises a problem that the such a thermal sheet 105 having a great flexibility and a high thermal conductivity are made of material such as porous graphite material and multi-metal-film layered material which are quite difficult and expensive to manufacture.

SUMMARY OF THE INVENTION

The present invention is addressed to those aforementioned problem, the object of the present invention is to provide a semiconductor module which can effectively dissipate heat generated by the semiconductor components disposed on the circuit board, with a simple structure to manufacture inexpensively.

The semiconductor module according to first aspect of the present invention comprises: a circuit board; a plurality of semiconductor components mounted in a matrix (m lines by n rows, m and n are natural numbers) on the circuit board; and a plurality of heat-spreaders arranged in a matrix (m lines by n rows), each of said heat-spreaders closely contacting each of said semiconductor components; wherein the first line and m-th line of said heat-spreaders are bonded onto said circuit board, and wherein said heat-spreaders at least in lines are bonded to adjacent ones. Thus, even where the mounting heights of the semiconductor components are deviated one another, since each of the heat-spreaders is individually assembled onto the circuit board in a simple manner, to closely contact with the semiconductor components. Therefore, the semiconductor module of the present invention can effectively dissipate heat generated by the semiconductor components directly through the heat-spreaders with a simple structure to manufacture inexpensively.

According to the semiconductor module of the present invention, the natural number n is 1, and m pieces of the heat-spreaders are arranged in a line, and wherein m pieces of the heat-spreaders are bonded to adjacent ones.

According to the semiconductor module of the present invention, each of the heat-spreaders has a step portion with a predetermined height, and wherein the heights of the heat-spreaders is greater than those of the semiconductor components and shorter than those of the the heat-spreaders.

The semiconductor module according to second aspect of the present invention comprises: a circuit board; a plurality of semiconductor components mounted in a matrix (m lines by n rows, m and n are natural numbers) on the circuit board; and a plurality of heat-spreaders arranged in a matrix (m lines by n rows) to closely contact each of the semiconductor components; wherein said heat-spreaders are bonded onto said circuit board. Thus, even where the mounting heights of the semiconductor components are deviated one another, since each of the heat-spreaders is individually bonded or secured onto the circuit board in a simple manner, so as to closely contact with the semiconductor components. Therefore, the semiconductor module of the present invention can effectively dissipate heat generated by the semiconductor components directly through the heat-spreaders with a simple structure to manufacture inexpensively.

According to the semiconductor module of the present invention, each of the heat-spreaders has a step portion with a predetermined height that are substantially the same as those of the semiconductor components.

The semiconductor module according to third aspect of the present invention comprises: a circuit board; a plurality of semiconductor components mounted in a matrix (m lines by n rows, m and n are natural numbers) on the circuit board; and a heat-spreader having a plurality of contacting regions arranged in a matrix (m lines by n rows) to closely contact each of the semiconductor components; wherein said heat-spreaders are bonded onto said circuit board. Therefore, the semiconductor module of the present invention can effectively dissipate heat generated by the semiconductor components directly through the heat-spreaders with a simple structure to manufacture inexpensively.

According to the semiconductor module of the present invention, the heat-spreader includes at least one opening around each of the contacting regions. Such an integrated heat-spreader with preferably many openings increases its flexibility so that the heat-spreader can be easily curved to more strongly press each semiconductor component toward the circuit board. Therefore, the semiconductor components can closely contact with the heat-spreader without leaving a gap therebetween even where the mounting heights of the semiconductor component are different from one another. Eventually, the semiconductor module can effectively dissipate heat generated by the semiconductor components.

The semiconductor module of the present invention, comprises bonding means for bonding said first line and m-th line of said heat-spreaders onto said circuit board; wherein the circuit board incorporates a heat-diffusing member with a high thermal conductivity, and wherein at least one bonding means contacts with the heat-diffusing member. Thus, heat generated by the semiconductor components can be diffused through the thermal sheet and the heat-spreader not only to the atmosphere but also to the metal-core material further through the bolts. Thus, the semiconductor module can more effectively dissipate heat generated by the semiconductor components with a simple module structure.

The semiconductor module of the present invention, comprises bonding means for bonding said heat-spreaders onto said circuit board; wherein the circuit board incorporates a heat-diffusing member with a high thermal conductivity, and wherein at least one bonding means contacts with the heat-diffusing member. Thus, heat generated by the semiconductor components can be diffused through the thermal sheet and the heat-spreader not only to the atmosphere but also to the metal-core material further through the bolts. Thus, the semiconductor module can more effectively dissipate heat generated by the semiconductor components with a simple module structure.

According to the semiconductor module of the present invention, each of the heat-spreaders with a region contacting with each of the semiconductor components is formed so that the region is as wide as possible.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention become more fully understood from the detailed description given hereinafter and accompanying drawings which are given by way of illustration only, and thus are not limitative of the present invention and wherein.

DETAILED DESCRIPTION OF THE PREFERRED EMBODIMENTS

Embodiment 1

Figure 1:
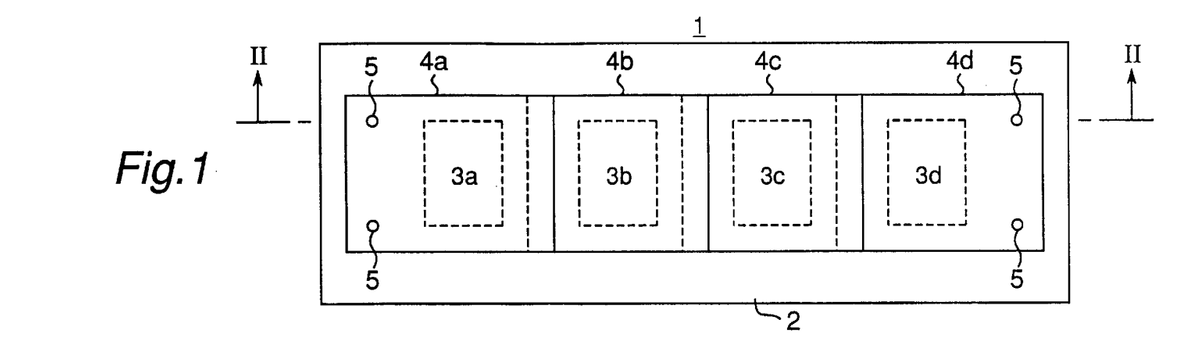
FIG. 1 is a schematic top view of the semiconductor module according to Embodiment 1 of the present invention.
Figure 2A:
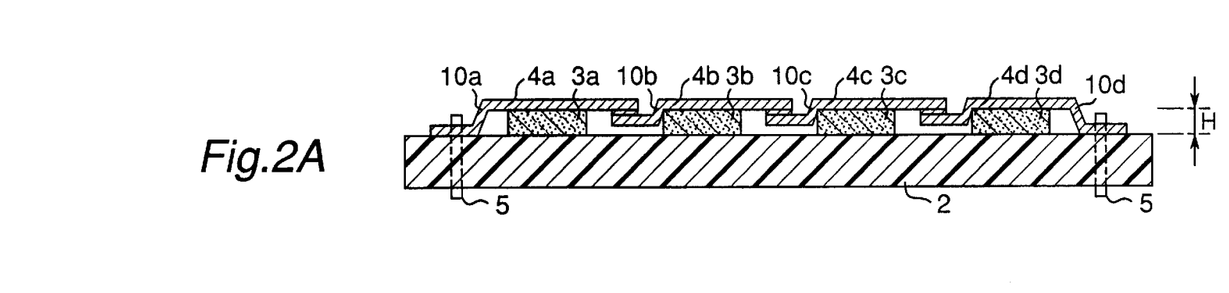
FIGS. 2A and 2B are cross sectional views taken along a line II—II in FIG. 1.
Figure 2B:
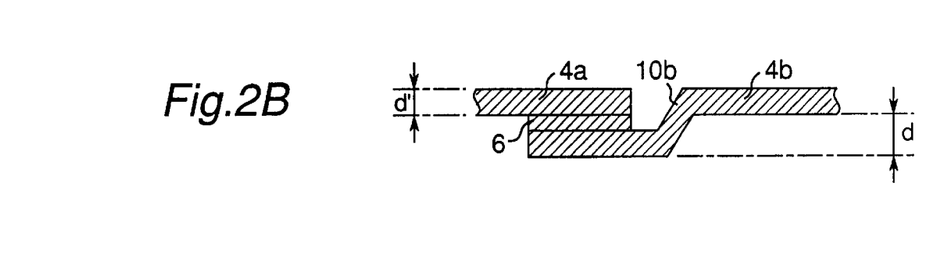

FIG. 1 is a schematic top view of the semiconductor module according to Embodiment 1 of the present invention. Also, FIG. 2 is a cross sectional view taken along a line II—II in FIG. 1. As shown in the drawings, the semiconductor module 1 of the present invention comprises, in general, a circuit board 2 made of material such as epoxy resin and a circuit pattern printed thereon (not shown). The semiconductor module 1 further comprises a plurality (four pieces in the drawings) of semiconductor components 3 (for example, memory devices 3a, 3b, 3c, 3d) which are connected with the aforementioned circuit patterns and are arranged in a line on the circuit board 2. Each of semiconductor components 3 generally has a height from the surface of the circuit board 2 to the top surface thereof, of which height is referred to as a "mounting height H" hereinafter. As described above, the mounting heights of the semiconductor components 3 are slightly different or deviated from one another, for example, due to the mounting conditions of the semiconductor components 3. Thus, the semiconductors 3a, 3b, 3c, 3d have the mounting heights H slightly deviated from one another.

According to the present inventions, a Rambus DRAM (or simply, a "memory device") is referred to as one example of the semiconductor component, in the context of that the memory device produces enormous heat during the operation at a very high transfer rate.

Referring to FIGS. 1 and 2, each of the memory devices 3a, 3b, 3c, 3d arranged in a line on the circuit board 2 is covered respectively by heat-spreaders 4a, 4b, 4c, 4d made of material such as metal or alloy of aluminum with a comparatively high thermal conductivity. Although memory devices 3 and heat-spreaders 4 are referred in this specification to have rectangular top shapes, the present invention is not limited by the top shapes thereof. Each of the heat-spreaders 4 has a top surface, which is wide enough to cover the memory device 3 but not to overlap an adjacent one.

The heat-spreaders 4b and 4c covering the memory devices 3b and 3c in the middle have end portions, either of which (for example, left end portion in the drawings) is downwardly bent to form a step portion 10b, 10c with a predetermined height d, as shown in FIGS. 2B.

As shown in FIGS. 2A, the heat-spreaders 4d covering the most right-arranged memory device 3d has a right end portion also downwardly bent to form a step portion. Also, the heat-spreaders 4a covering the most left-arranged memory device 3a has a left end portion downwardly bent to form a step portion.

The predetermined heights d of step portion 10b, 10c of the heat-spreaders 4b, 4c are greater than the thickness d' of the heat-spreaders themselves, and less than the mounting height H of the semiconductor components. Preferably, the predetermined heights d of step portion 10b, 10c of the heat-spreaders 4b, 4c are slightly greater than the thickness d' of the heat-spreaders.

Contrary to this, it is preferable that the step portion 10a, 10d of the heat-spreaders 4a, 4d have predetermined heights substantially the same as the mounting height H of the memory devices, as shown in FIGS. 2A.

The heat-spreaders 4a, 4d are secured at the step portions onto the circuit board 2 with a securing member 5 such as rivets. In addition, each of the step portions of the heat-spreaders 4b, 4c has an upper surface bonded with a lower surface of the adjacent heat-spreader 4a and 4b, respectively, with a bonding member 6 such as solder.

As described above, even where the mounting heights of the memory devices 3 are deviated one another, since each of the heat-spreaders 4 is individually assembled onto the circuit board 2 in a simple manner, the assembler of the semiconductor module 1 can easily eliminate the substantial problem due to the variation of the mounting heights of the memory devices 3, by assembling each of the heat-spreaders 4 so as to closely contact with the memory devices 3, respectively. Thus, the semiconductor module 1 of the present invention can effectively dissipate heat generated by the memory devices 3 directly through the heat-spreaders 4. Furthermore, since the heat-spreaders 4 are bonded by solder 6, heat generated by any one of the memory devices 3 can quickly diffuse across the heat-spreaders 4a, 4b, 4c, 4d. In addition, the heat-spreaders 4 can be easily assembled onto the circuit board 2 according to the present invention.

Although solder is used as the bonding member 6 in Embodiment 1, it is clear for the persons skilled in the art that rivets can also be used for securing the heat-spreaders 4. Also, an adhesive with a high thermal conductivity may be used as the another bonding member 6.

Further, although rivets are utilized as the securing member 5 in Embodiment 1, bolts can be applied for securing the heat-spreaders 4a, 4d onto the circuit board 1.

In Embodiment 1, while the semiconductor module 1 having a plurality of memory devices 3 arranged in a line is described as above, the present invention may be also applied for a semiconductor module 1 having a plurality of memory devices 3 arranged in a matrix (m lines by n rows) on circuit board 2. When the heat-spreaders 4 are bonded with adjacent ones so that a row of heat-spreaders is formed, a row of heat-spreaders may be bonded with, or free from an adjacent row of heat-spreaders 4.

Figure 3A:
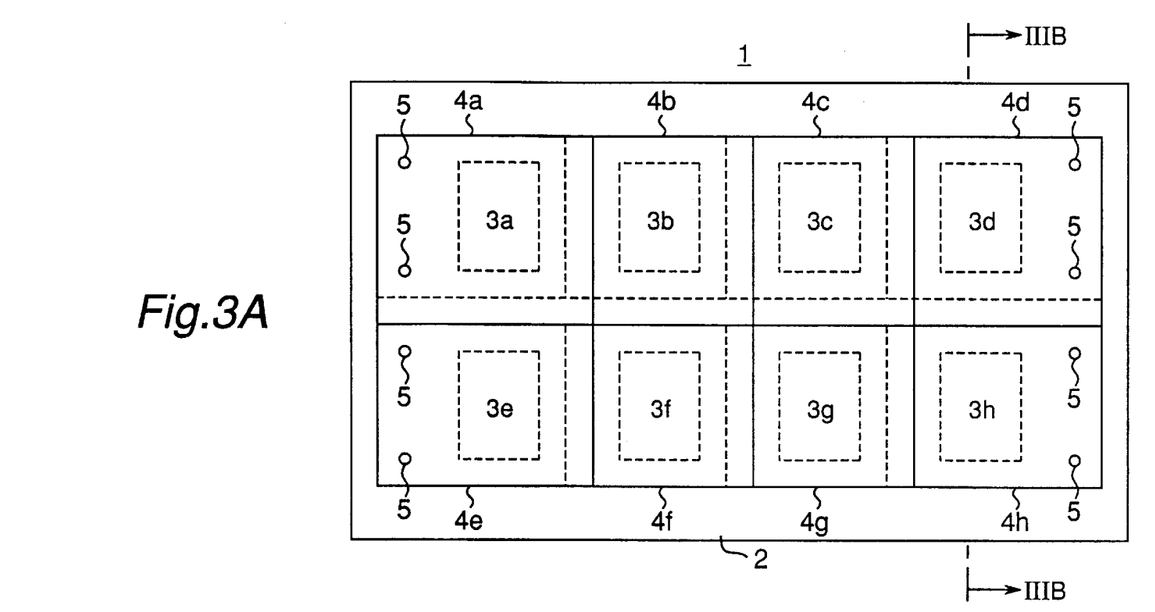
FIG. 3A is a schematic top view of the semiconductor module 1 having a plurality of memory devices 3 arranged in a matrix (4 lines by 2 rows) on circuit board 2.

FIG. 3A is a schematic top view of the semiconductor module 1 having a plurality of memory devices 3 arranged in a matrix (4 lines by 2 rows) on circuit board 2. Each of the heat-spreaders 4 is bonded with adjacent ones one another. The left-most heat-spreaders 4a, 4e and the right-most heat-spreaders 4d, 4h are secured at their step portions with the securing member 5 such as rivets onto the circuit board 2.

Figure 3B:
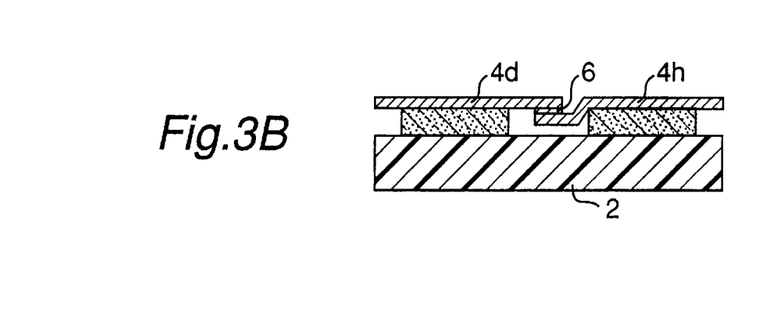
FIG. 3B is a cross sectional view taken along IIIB—IIIB line of FIG. 3A.

FIG. 3B is a cross sectional view taken along IIIB—IIIB line of FIG. 3A. The lower-arranged heat-spreaders 4e, 4f, 4g, 4h have another step portion also along the direction of the row, which are bonded by solder 6 with adjacent upper-arranged heat-spreaders 4a, 4b, 4c, 4d.

Again, referring to FIGS. 1 and 2, the manufacturing process of the semiconductor module 1 having a plurality of memory devices 3 arranged in a line will be described in detail hereinafter.

Firstly, a plurality of memory devices 3 are secured in a line onto the circuit board 2. Next, the heat-spreaders 4a, 4b, 4c, 4d are disposed on the memory devices 3. The heat-spreaders 4a, 4d are secured with bonding members 5 such as rivets on the circuit board 2 so that those memory devices 3a, 3d are closely contact with the corresponding heat-spreaders 4a, 4d.

Then, for example, the heat-spreaders 4b is bonded by solder with the heat-spreader 4a so as to closely contact with the memory device 3b. Also, the heat-spreaders 4c is bonded by solder with the heat-spreader 4b and 4d so as to closely contact with the memory device 3c. The bonding sequence can be reversed as described above.

As described above, the semiconductor module 1 according to Embodiment 1 of the present invention can be easily manufactured so that each of heat-spreaders 4 is assembled to closely contact with the corresponding memory devices 3.

Again, although solder is used as the bonding member 6 in Embodiment 1, an adhesive with a high thermal conductivity may be used as the bonding member 6.

Also, in Embodiment 1, while the semiconductor module 1 having a plurality of memory devices 3 arranged in a line is described, the present invention may be also applied for a semiconductor module 1 having a plurality of memory devices 3 arranged in a matrix (m lines by n row s) on circuit board 2.

Embodiment 2

Referring FIG. 4, the details of the semiconductor module 1 according to Embodiment 2 of the present invention will be described hereinafter. Although the semiconductor module 1 of the previous embodiment (Embodiment 1) comprises a plurality of heat-spreaders 4a, 4b, 4c, 4d that are bonded together by solder to be integrated as one piece.

Meanwhile, the semiconductor module 1 of Embodiment 2 is similar to that of Embodiment 1 except that each heat-spreader 4 is independently secured on the circuit board 2 and that each heat-spreader 4 closely contact with not only the top surface but also the side surfaces of the memory device. Therefore, the details for the semiconductor module 1 of Embodiment 2, which are similar to those of Embodiment 1, will not be described herein.

Figure 4A:
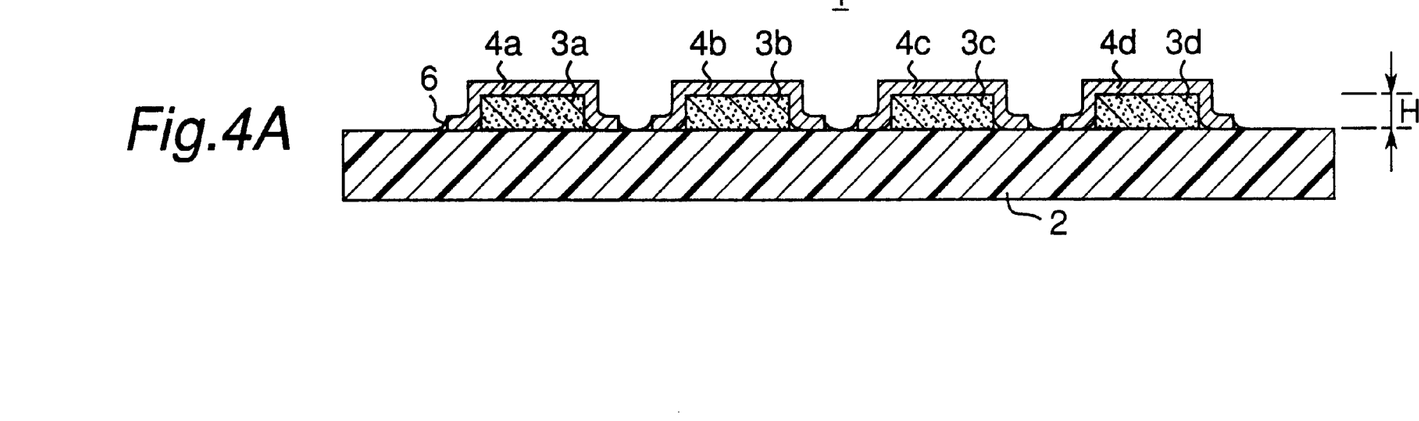
FIGS. 4A and 4B are schematic cross sectional views of the semiconductor module 1 according to Embodiment 2.
Figure 4B:
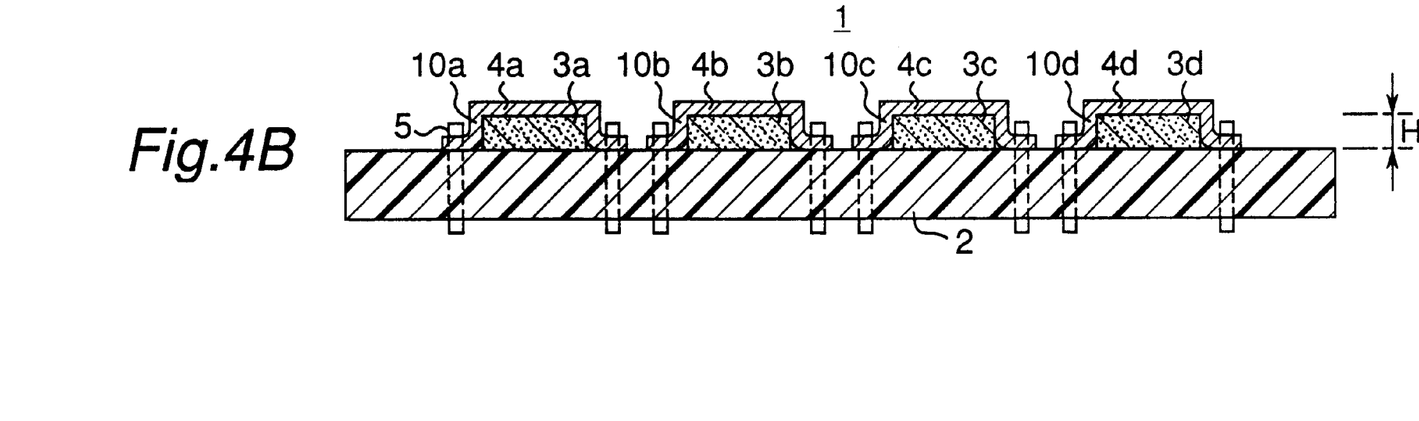

FIG. 4 is a schematic cross sectional view of the semiconductor module 1 according to Embodiment 2. As described above, each of heat-spreaders 4a, 4b, 4c, 4d is independently secured on the circuit board 2. FIG. 4A is a schematic cross sectional view of the semiconductor module 1 including a plurality of heat-spreaders 4 bonded onto the circuit board 2 by solder 6. FIG. 4B is a schematic cross sectional view of the semiconductor module 1 including a plurality of heat-spreaders 4 secured onto the circuit board 2 by rivets 5.

The semiconductor module 1 includes heat-spreaders 4, each of which has a rectangular top surface. Each of the heat-spreader 4 has a pair of opposing end portions bent downwardly to form step portions as shown in FIG. 4. The step height of each step portion is adjusted so that it corresponds to the mounting height H of the memory device 3. In other words, each heat-spreader 4 is formed to have an U-shaped configuration so that the memory device 3 closely contact with the heat-spreader 4. The heat-spreader 4 so constructed covers the memory device 3 and is secured onto the circuit board 2 by solder 6 or rivets 5. Thus, the heat-spreaders 4 can closely contact with the memory device 3 to effectively diffuse heat generated therefrom during the operation of the memory device 3. Further, as described above, the heat-spreaders 4 of the semiconductor module 1 according to Embodiment 2, closely contact with not only the top surface but also side surfaces of the memory device 3 to dissipate heat more effectively.

Embodiment 3

Figure 5A:
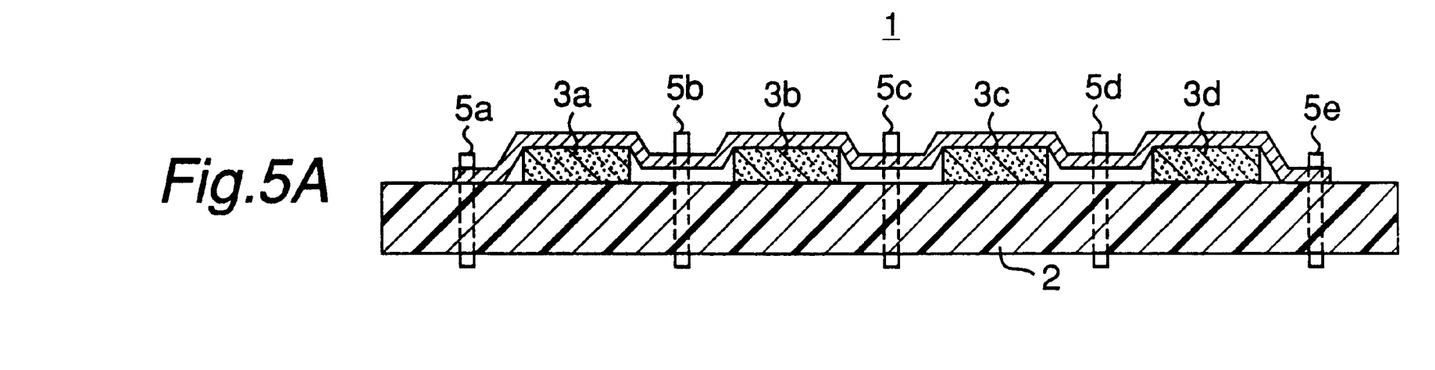
FIG. 5A is a schematic cross sectional view of the semiconductor module 1 according to Embodiment 3.
Figure 5B:
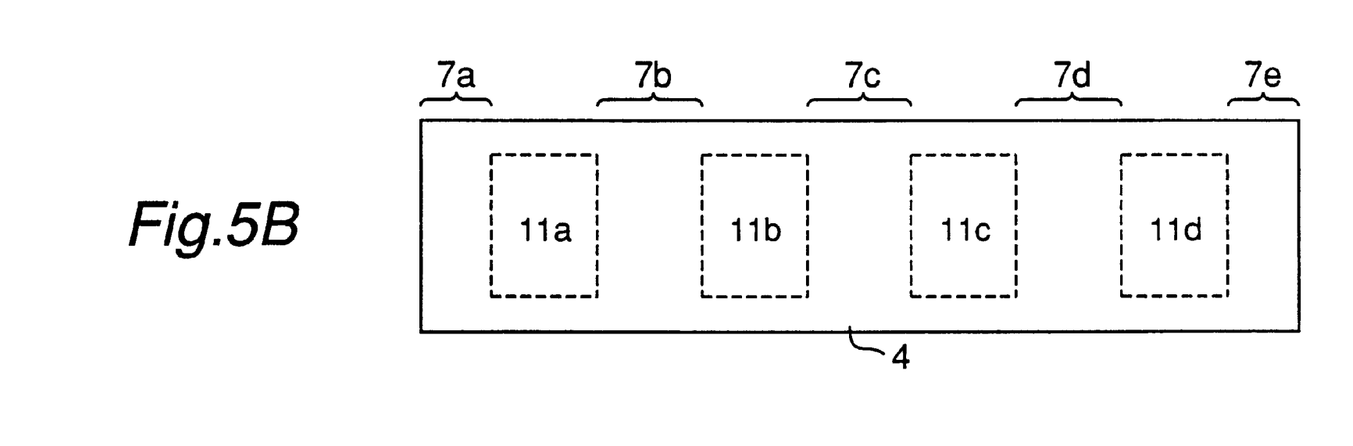
FIG. 5B is a top view of the integrated heat-spreader 4.

Referring to FIG. 5, the semiconductor module 1 according to Embodiment 3 of the present invention will be described in detail hereinafter. The semiconductor module 1 according to Embodiment 3 is similar to that of Embodiment 2 except that an integrated heat-spreader covering a plurality of memory devices 3 is used rather than a plurality of the individual heat-spreaders 4. Therefore, the details for the semiconductor module 1 of Embodiment 3, which are similar to those of Embodiment 2, will not be described herein.

FIG. 5A is a schematic cross sectional view of the semiconductor module 1 according to Embodiment 3. As described above, the semiconductor module 1 according to Embodiment 3 comprises an integrated heat-spreader 4. FIG. 5B is a top view of the integrated heat-spreader 4. As shown in the drawings, the integrated heat-spreader 4 includes a plurality of contacting regions 11a, 11b, 11c, 11d, each of which is formed with the U-shaped configuration to cover on and fit with the top surfaces of a plurality of memory devices 3a, 3b, 3c, 3d, respectively. Further, the integrated heat-spreader 4 includes bending regions 7a, 7b, 7c, 7d, 7e at both sides and between the contacting regions 11.

The integrated heat-spreader 4 is disposed on the memory devices 3 and secured at the bending portions 7 by rivets onto the circuit board 2. Since the rivets 5 cause the heat-spreader 4 to surely press or bias the memory device 3 towards the circuit board 2, even where the mounting height H are different one another, so that the heat-spreader 4 can closely contact with the memory devices 3 without leaving a gap therebetween. Preferably, the heat-spreader has some flexibility. Thus, the semiconductor module 1 according to Embodiment 3 can effectively diffuse heat with such a simple structure.

In Embodiment 3, although rivets are used as the securing member 5 for securing the heat-spreader 4 onto the circuit board 2, bolts may be substituted for rivets as the securing member 5.

Also, in Embodiment 3, while the heat-spreader 4 is formed with the U-shaped configuration any configuration or profile can be applied for covering on and fitting with the top surface of a plurality of memory devices 3.

Embodiment 4

Figure 6:
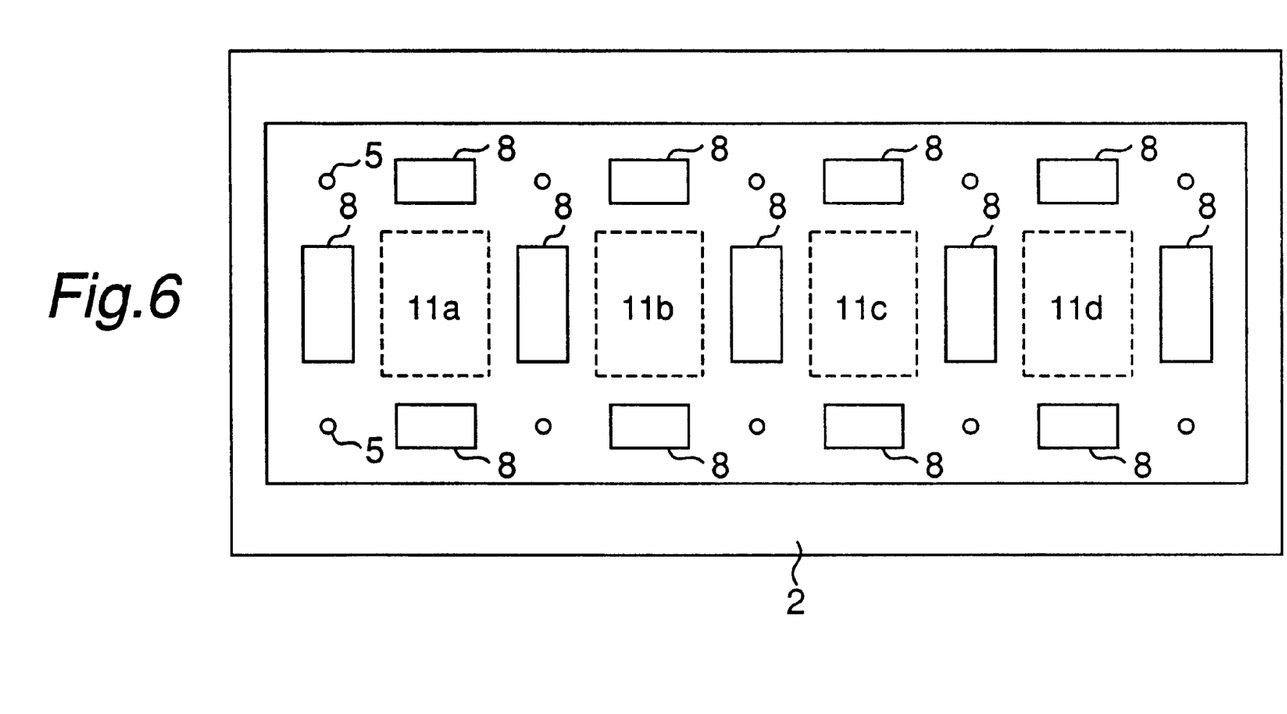
FIG. 6 is a top view of the integrated heat-spreader 4 according to Embodiment 4 including at least one of openings 8 around the contacting regions 11.

Referring to FIG. 6, the semiconductor module 1 according to Embodiment 4 of the present invention will be described in detail hereinafter. The semiconductor module 1 according to Embodiment 4 is similar to that of Embodiment 3 except that the integrated heat-spreader further includes at least one of openings 8 around the contacting regions 11a, 11b, 11c, 11d. In other words, at least one of openings 8 are disposed at the portion of the heat spreader 4 adjacent to the end portions and side portions of each contacting regions 11. Therefore, the details for the semiconductor module 1 of Embodiment 4, which are similar to those of Embodiment 3, will not be described herein.

Such an integrated heat-spreader 4 with many openings 8 increases its flexibility. Thus, when the bending portions 7 of the heat-spreader 4 is secured onto the circuit board 2, since the heat-spreader 4 can be easily curved to more strongly press each memory device 3 toward the circuit board 1. This causes an advantage because the memory devices can closely contact with the heat-spreader 4 without leaving a gap therebetween even where the mounting heights of the memory device 3 are deviated one another. Eventually, the semiconductor module according to Embodiment 4 can effectively dissipate heat generated by the semiconductor components 3.

Although the profile of the openings 8 is rectangular, any profiles such as an ellipse can be applied to the opening 8.

Also, in FIG. 6, although there are four openings 8 around each contacting region 11, a plurality of small holes with a predetermined distance may be arranged around each contacting region 11 for increasing the flexibility of the heat-spreader 4. Alternatively, the openings 8 may be arranged just on bending portions 7 of the heat-spreader 4.

Embodiment 5

Figure 7:
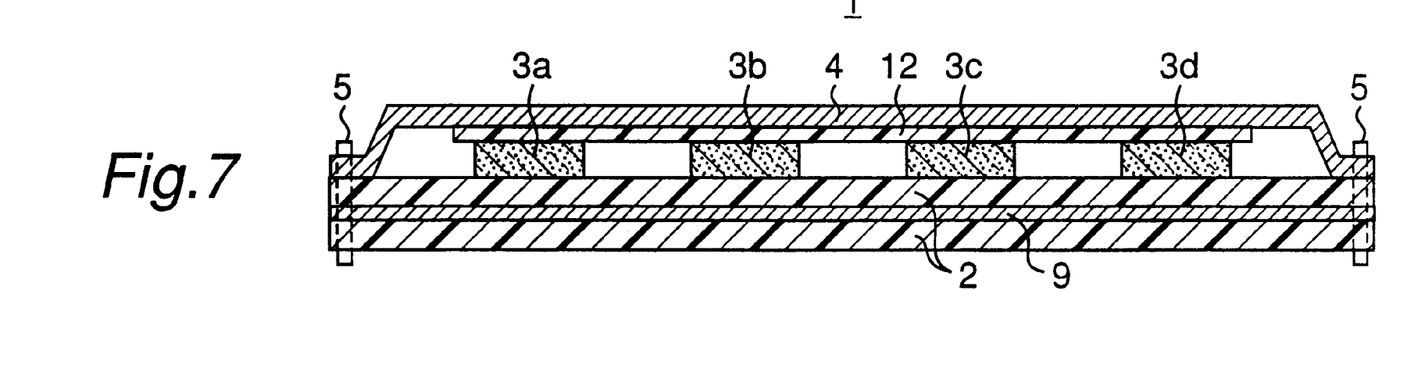
FIG. 7 is a schematic cross sectional view of the semiconductor module 1 according to Embodiment 3 having a circuit board 2, in which the metal-core material 9 made of metal such as copper with a plate shape is embedded or incorporated.

Referring to FIG. 7, the semiconductor module 1 according to Embodiment 5 of the present invention will be described in detail hereinafter. The semiconductor module 1 according to Embodiment 5 comprises a circuit board 2, in which the metal-core material 9 made of metal such as copper with a plate shape is embedded or incorporated. Also, the metal-core material 9 is penetrated by or contacted with at least the securing member 5 such as bolts. The semiconductor module 1 according to Embodiment 5, in general, comprises a plate-shaped heat-spreader 4 and a thermal sheet 12 interposed between the memory device 3 and the heat-spreader 4. Other structures are similar to the conventional semiconductor module 101 described in FIG. 8B, thus, the details for the semiconductor module 1 of Embodiment 5, which are similar to those of the conventional semiconductor module 101, will not be described herein.

As described above, the semiconductor module 1 of Embodiment 5 comprises a circuit board 2, which is preferably embedded with the metal-core material 9 made of metal such as copper with a plate shape. And preferably, the bolts 5 for securing the heat-spreader 4 onto the circuit board 2 penetrated the metal-core material 9. Therefore, heat generated by the memory devices 3 are diffused through the thermal sheet 12 and the heat-spreader 3 not only to the atmosphere but also to the metal-core material 9 further through the bolts 5. Thus, the semiconductor module 1 of Embodiment 5 can more effectively dissipate heat generated by the memory devices 3 with a simple module structure.

Although the metal-core material 9 is made of metal such as copper with a plate shape, any shapes and material may be used, for example, the material which has a high thermal conductivity other than aluminum metal and a bar shape or a fin shape, can be utilized for the metal-core material 9.

It is clear to persons skilled in the art that the metal-core material 9 according to Embodiment 5 can be applied to each of the aforementioned Embodiment 1 through 4, therefore, the semiconductor module 1 which can further effectively dissipate heat generated by the memory devices 3 can be obtained.

What is claimed is:

1. A semiconductor module, comprising:

a circuit board;

a plurality of semiconductor components mounted on the circuit board; and a plurality of heat-spreaders, each one of said plurality of heat-spreaders contacting a corresponding one of said plurality of semiconductor components;
      wherein at least one of said heat-spreaders is secured onto said circuit board, and
      wherein at least one pair of adjacent heat-spreaders are bonded to each other.

2. The semiconductor module according to claim 1,
   wherein at least two of said plurality of heat-spreaders are arranged in a row, and
   wherein each one of said at least two heat-spreaders is bonded to an adjacent heat-spreader.

3. The semiconductor module according to claim 1,
   wherein each one of said plurality of heat-spreaders has a step portion with a predetermined height.

4. The semiconductor module according to claim 1, further comprising:
   securing means for securing said at least one of said heat-spreaders onto said circuit board;
      wherein said circuit board incorporates a heat-diffusing member with a high thermal conductivity, and
      wherein at least one securing means contacts said heat-diffusing member.

5. The semiconductor module according to claim 1,
   wherein each one of said plurality of semiconductor components has a top surface having a predetermined area, and
   wherein each one of said plurality of heat-spreaders has a contacting surface having at least the predetermined area of the top surface of the corresponding one of said plurality of semiconductor components.

6. The semiconductor module according to claim 1, wherein each one of said plurality of semiconductor components is positioned between a corresponding one of said plurality of heat-spreaders and said circuit board.

7. The semiconductor module according to claim 1, wherein each one of said plurality of semiconductor components contacts said circuit board.

8. The semiconductor module according to claim 1, wherein each one of said plurality of heat-spreaders covers a top surface of a corresponding one of said plurality of semiconductor components.

9. The semiconductor module according to claim 1, wherein at least one of said plurality of heat-spreaders is entirely spaced away from said circuit board.

10. The semiconductor module according to claim 1, further comprising a bonding member for bonding said at least one pair of adjacent heat-spreaders to each other, wherein said bonding member is one of solder and adhesive.

11. The semiconductor module according to claim 3, wherein the predetermined height of the step portion of one or more of said plurality of heat-spreaders is greater than the thickness of the one or more of said plurality of heat-spreaders, and smaller than a mounting height of a corresponding semiconductor component.

12. The semiconductor module according to claim 3, wherein the predetermined height of the step portion of one or more of said plurality of heat-spreaders is substantially the same as a mounting height of a corresponding semiconductor component.

13. The semiconductor according to claim 1, wherein said heat-spreaders are arranged in a matrix of at least one row and a plurality of columns, said plurality of columns including a first column and a last column, wherein heat-spreaders located in the first and last column of the matrix are secured onto the circuit board via a securing member extending through the corresponding heat-spreader and the circuit board.

* * * * *